(12) United States Patent
Schwartz

(10) Patent No.: US 9,952,355 B1
(45) Date of Patent: Apr. 24, 2018

(54) SPATIALLY CONTROLLED CONDUCTIVITY IN TRANSPARENT OXIDE COATINGS

(71) Applicant: Goodrich Corporation, Charlotte, NC (US)

(72) Inventor: Bradley D. Schwartz, Brewster, NY (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 15/457,021

(22) Filed: Mar. 13, 2017

(51) Int. Cl.
| | |
|---|---|
| *B32B 3/02* | (2006.01) |
| *G02B 1/16* | (2015.01) |
| *H01L 21/02* | (2006.01) |
| *C23C 14/48* | (2006.01) |
| *C23C 14/04* | (2006.01) |
| *C23C 16/04* | (2006.01) |
| *C23C 16/513* | (2006.01) |

(52) U.S. Cl.
CPC .............. *G02B 1/16* (2015.01); *C23C 14/042* (2013.01); *C23C 14/48* (2013.01); *C23C 16/042* (2013.01); *C23C 16/513* (2013.01); *H01L 21/02565* (2013.01); *H01L 21/02664* (2013.01)

(58) Field of Classification Search
CPC ............... G02B 1/16; H01L 21/02565; H01L 21/02664; C23C 14/042; C23C 16/042
See application file for complete search history.

(56) References Cited

U.S. PATENT DOCUMENTS

| | | |
|---|---|---|
| 4,093,357 A | 6/1978 | Jacobson et al. |
| 8,236,680 B2 | 8/2012 | Marks et al. |
| 9,036,242 B2 | 5/2015 | Bergh et al. |
| 9,091,895 B2 | 7/2015 | Bergh et al. |
| 9,249,504 B2 | 2/2016 | Burberry et al. |
| 9,507,233 B2 | 11/2016 | Bergh et al. |

*Primary Examiner* — Elizabeth E Mulvaney
(74) *Attorney, Agent, or Firm* — Locke Lord LLP; Scott D. Wofsy; Joshua L. Jones

(57) ABSTRACT

A method of coating an optical substrate includes depositing a semiconductor coating over a surface of an optical substrate, wherein the semiconductor coating has broadband optical transmittance. Portions of the semiconductor coating are doped to form a spatially varied pattern of doped semiconductor in the semiconductor coating. The method includes annealing the semiconductor coating to do at least one of: increase oxygen in undoped areas of the semiconductor coating; or reduce oxygen in doped areas of the semiconductor coating.

22 Claims, 5 Drawing Sheets

SPATIALLY CONTROLLED CONDUCTIVITY IN TRANSPARENT OXIDE COATINGS

BACKGROUND OF THE INVENTION

1. Field of the Invention

The present disclosure relates to optical coatings, and more particularly to electrically conductive optical coatings.

2. Description of Related Art

Electro-optic (EO) systems require windows to protect the sensor and electronics from outside elements. In addition to rain, dust, and the like, in many cases the window must also block electromagnetic interference (EMI) that would otherwise impede the EO system performance.

EMI shielding can be accomplished with a window that is electrically conductive and optically transparent. There are three conventional types of shielding.

The first type of EMI shielded window uses a semiconductor material such as silicon or germanium that is doped with a group V element such as phosphorous, arsine, or antimony to supply additional electrons to provide electrical conductivity. These windows are opaque for visible wavelengths and are thus not useful for broadband EO systems.

The second type of shielded window uses a continuous, transparent, conductive coating. These coatings consist of wide bandgap semiconductors such as indium oxide ($In_2O_3$) and zinc oxide (ZnO) that have broadband optical transparency. The semiconductors are doped to provide electrical conductivity. However, as doping increases to increase electrical conductivity and EMI attenuation, optical transmittance decreases. This effect begins at longer wavelengths where both plasma reflectance and free-carrier absorption from electrons decrease transmittance. Traditional transparent, conductive semiconductor coatings are practical only in the 0.4 to 2.0 micron range, short wavelength visible through short wavelength infrared, (SWIR).

The third type of shielded window is traditionally required for broadband applications from the visible to the long-wave infrared (LWIR). A grid of fine metal lines is applied on the surface of the window. Typical dimensions are 5-micron wide lines with 140 micron spacing. These gridded windows enable optical transmittance over a broad wavelength range, but they limit optical transmittance by obscuration and scattering.

U.S. Pat. No. 9,276,034 presents a method for reducing the optical scattering from a conductive grid. Channels are etched into a window substrate, and an electrically conductive semiconductor is deposited in the channels such that the surface of the window is planar. The semiconductor is transparent for visible and short wavelength infrared (SWIR) wavelengths but reflecting and absorbing for mid wavelength infrared (MWIR) and longer wavelengths. Using a semiconductor with an index of refraction close to that of the substrate minimizes light scattering from the grid lines.

The conventional techniques have been considered satisfactory for their intended purpose. However, there is an ever present need for improved electrically conductive optical coatings, e.g., for broad band optics. This disclosure provides a solution for this problem.

SUMMARY OF THE INVENTION

A method of coating an optical substrate includes depositing a semiconductor coating over a surface of an optical substrate, wherein the semiconductor coating has broadband optical transmittance. Portions of the semiconductor coating are doped to form a spatially varied pattern of doped semiconductor in the semiconductor coating. The method includes annealing the semiconductor coating to do at least one of: increase oxygen in undoped areas of the semiconductor coating; or reduce oxygen in doped areas of the semiconductor coating.

Annealing the semiconductor coating can include laser annealing in a predetermined pattern to improve the crystal quality of transparent conducting oxide (TCO) materials of the semiconductor coating and increase electrical conductivity in doped areas of the semiconductor coating.

Annealing the semiconductor coating can include annealing in air to activate and diffuse dopant and increase oxygen in undoped areas of the semiconductor coating. Doping portions of the semiconductor coating can include:
  applying a photoresist over the semiconductor coating;
  selectively exposing the photoresist;
  developing the photoresist in the pattern;
  doping the semiconductor coating through openings in the photoresist;
  removing the photoresist to leave the doped semiconductor in the pattern on the semiconductor coating;
  applying a coating of silicon oxynitride over the entire surface of the semiconductor coating;
  applying a photoresist over the silicon oxynitride, exposing the photoresist, and developing the photoresist;
  removing portions of the silicon oxynitride not covered by photoresist and then removing any remaining photoresist; and
  wherein annealing the semiconductor coating includes annealing the silicon oxynitride and semiconductor coating in air to activate and diffuse dopant and increase oxygen in undoped areas of the semiconductor coating.

It is also contemplated that annealing the semiconductor coating can include annealing under vacuum to activate and diffuse dopant and reduce oxygen in doped areas of the semiconductor coating. Doping portions of the semiconductor coating can include:
  applying a coating of silicon oxynitride over the entire surface of the semiconductor coating with the semiconductor undoped;
  applying a photoresist over the silicon oxynitride, exposing the photoresist, and developing the photoresist;
  removing portions of the silicon oxynitride not covered by photoresist;
  doping the semiconductor coating through openings in the photoresist;
  removing the photoresist to leave the doped semiconductor in the pattern on the semiconductor coating; and
  wherein annealing the semiconductor coating includes annealing the silicon oxynitride and semiconductor coating in vacuum to activate and diffuse dopant and reduce oxygen in doped areas of the semiconductor coating.

The semiconductor coating can include at least one of $In_2O_3$ or ZnO. Doping portions of the semiconductor coating to form a spatially varied pattern can include applying dopant by ion implantation, a spin-on or spray-on dopant solution, or other methods. The doped semiconductor can include at least one of Sn, Mo, W, Ti, Al, or Ga. The semiconductor coating can have broadband optical transmittance in at least visible and infrared spectra. Depositing the semiconductor coating can include depositing the semiconductor coating with the semiconductor coating undoped.

Doping portions of the semiconductor coating and annealing the semiconductor coating can include diffusing the dopant atoms through the semiconductor coating to the optical substrate. Depositing a semiconductor coating can include depositing the semiconductor coating over a surface of the optical substrate in its entirety. Doping portions of the semiconductor coating to form a spatially varied pattern can include doping a surface of the semiconductor coating so a surface of the semiconductor coating is covered in its entirety with the pattern. The semiconductor coating including annealed activated doped semiconductor in the semiconductor coating and the optical substrate can be formed into a window without etching and/or without polishing or post-process planarization. The activated doped semiconductor and the semiconductor coating can have closely matched indices of refraction to mitigate light scattering from the pattern. If the ratio of the indices of refraction of the doped semiconductor and semiconductor coating is between 0.82 and 1.22, the interface reflection will be less than 1% at normal incidence. For example, the indices of refraction of doped and undoped $In_2O_3$ at 632.8 nm are about 2.00 and 1.77, respectively. The index ratio of 1.13 produces a reflection of only 0.37%. The method can include making the doped semiconductor electrically conductive. Hydrogen can be added to the doped semiconductor to increase conductivity by adding electrons and passivating defects, such as by a plasma-enhanced chemical vapor deposition (PECVD) silicon oxynitride process or use of a hydrogen plasma.

A window includes a transparent substrate with a coating over the transparent substrate, the coating being made of both a transparent semiconductor and an electrically conductive semiconductor with lower transparency than the transparent semiconductor, the electrically conductive semiconductor being annealed and distributed in a spatially varied pattern in the transparent semiconductor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
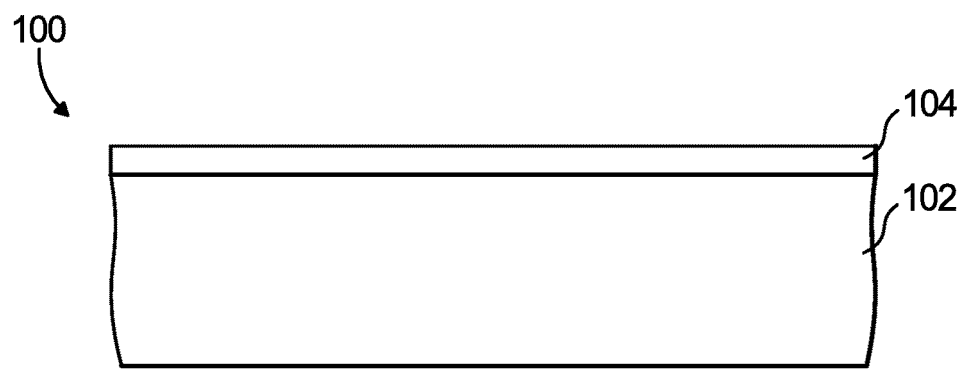
FIG. 1 is a schematic cross-sectional elevation view of an exemplary embodiment of a window or optic constructed in accordance with the present disclosure, showing a semiconductor coating on an optical substrate.

Reference will now be made to the drawings wherein like reference numerals identify similar structural features or aspects of the subject disclosure. For purposes of explanation and illustration, and not limitation, a partial view of an exemplary embodiment of a window or optic in accordance with the disclosure is shown in FIG. 1 and is designated generally by reference character 100. Other embodiments of windows or optics in accordance with the disclosure, or aspects thereof, are provided in FIGS. 2-15, as will be described. The systems and methods described herein can be used to provide spatially controlled or varied electrical conductivity in transparent oxide coatings for optics and windows. This can be used for electromagnetic interference (EMI) shielding, spatially varying sheet resistance for smart window applications, or any other suitable application.

Transparent, conductive oxides (TCO) such as indium tin oxide (ITO) and aluminum zinc oxide (AZO) are important coating materials for a wide variety of products that require optical transparency and electrical conductivity. The indium oxide ($In_2O_3$) and zinc oxide (ZnO) wide bandgap semiconductors have broadband optical transparency. The materials can be doped to provide electrical conductivity. However, as doping rises to increase electrical conductivity, optical transmittance decreases. This effect begins at longer wavelengths where both plasma reflectance and free-carrier absorption from electrons decrease transmittance. The common conductive oxide coatings are generally transparent only in the 0.4 to 2.0 micron wavelength range. This disclosure explains methods to spatially control the conductivity and transmittance of a transparent oxide thin film in different areas of a coating.

A method of coating an optical substrate 102 includes depositing a semiconductor coating 104 over a surface of an optical substrate 102, e.g. over the entire surface of the optical substrate 102. Depositing the semiconductor coating 104 can include depositing the semiconductor coating 104 with the semiconductor coating 104 undoped, and in the presence of oxygen. Alternatively or in addition, oxide semiconductors can be annealed in air to provide excess oxygen in the semiconductor coating 104. The semiconductor coating 104 has broadband optical transmittance as a transparent conducting oxide (TCO) material, and can include $In_2O_3$, ZnO, or the like, e.g., wherein the electrical sheet resistance is greater than 2000 ohms/square. The semiconductor coating can therefore have broadband optical transmittance in at least visible and infrared spectra.

Portions of the semiconductor coating 104 are doped to form a spatially varied pattern of doped semiconductor in the semiconductor coating as described further below. Doping portions of the semiconductor coating to form a spatially varied pattern can include applying dopant by ion implantation of donor atoms. Any other suitable technique can be used without departing from the scope of this disclosure, such as spin-on or spray-on dopant solutions. The doped semiconductor can include at least one of Sn, Mo, W, Ti, Al, or Ga. Hydrogen can serve as an electron donor and can passivate defects.

The method includes annealing the semiconductor coating 104 to diffuse the dopant atoms through the semiconductor coating and to do at least one of: increase oxygen in undoped areas of the semiconductor coating; or reduce oxygen in doped areas of the semiconductor coating. Each of these is described below.

Figure 2:
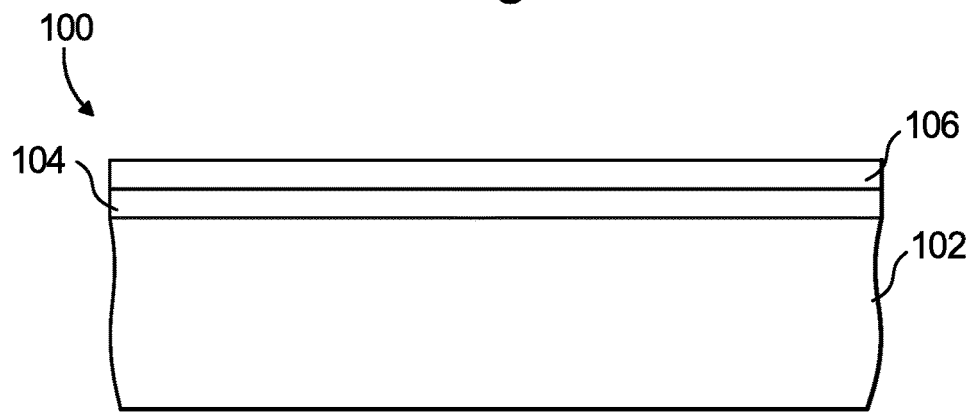
FIG. 2 is a schematic cross-sectional elevation view of the window or optic of FIG. 1, showing a layer of photoresist deposited on the semiconductor coating.
Figure 3:
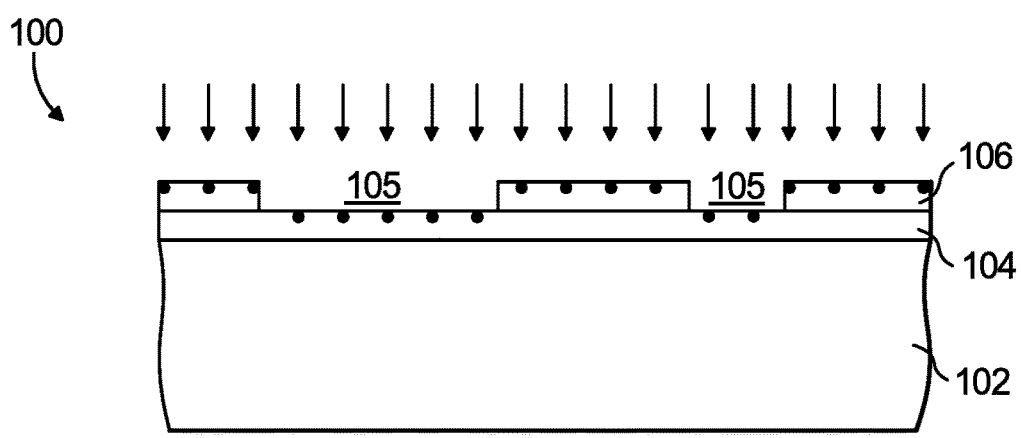
FIG. 3 is a schematic cross-sectional elevation view of the window or optic of FIG. 2, showing a portion of the developed photoresist removed to allow doping of the semiconductor coating in a predetermined spatially varied pattern.
Figure 4:
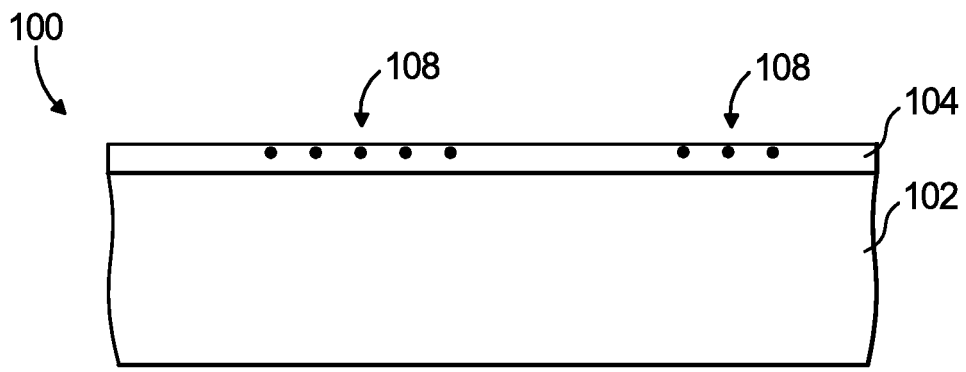
FIG. 4 is a schematic cross-sectional elevation view of the window or optic of FIG. 3, showing the photoresist removed and a doped pattern in the semiconductor coating.
Figure 5:
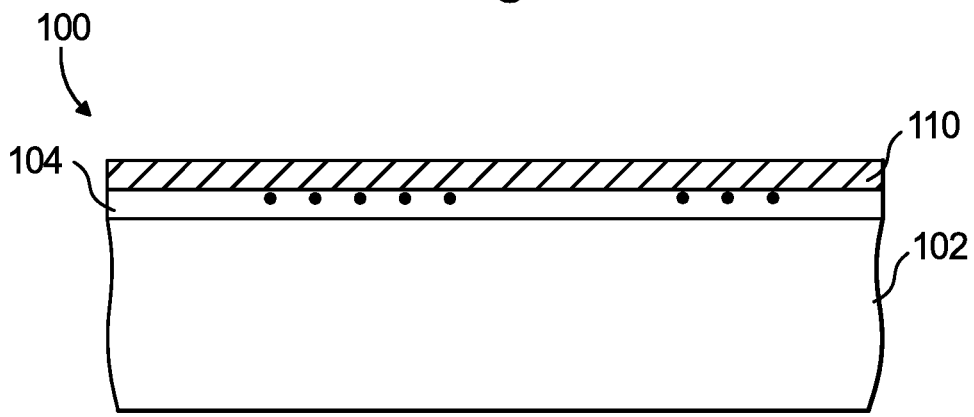
FIG. 5 is a schematic cross-sectional elevation view of the window or optic of FIG. 4, showing a layer of silicon oxynitride deposited on the semiconductor coating.
Figure 6:
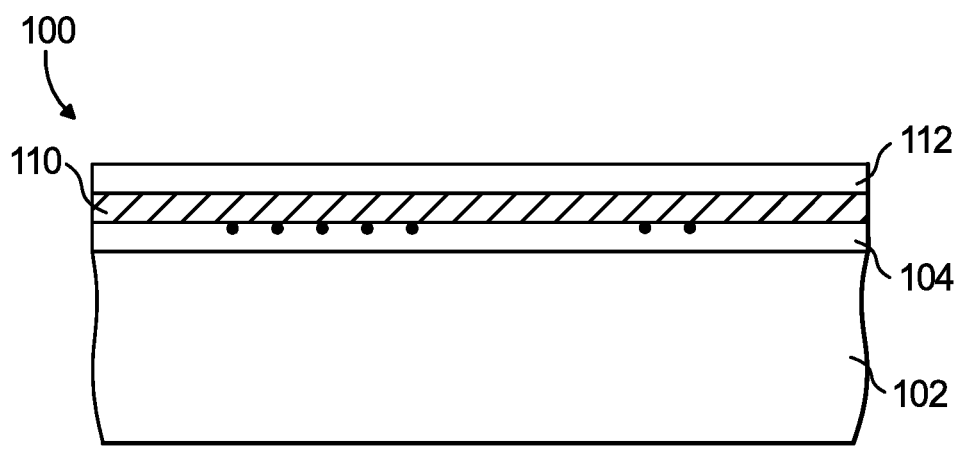
FIG. 6 is a schematic cross-sectional elevation view of the window or optic of FIG. 5, showing a layer of photoresist deposited on the silicon oxynitride.
Figure 7:
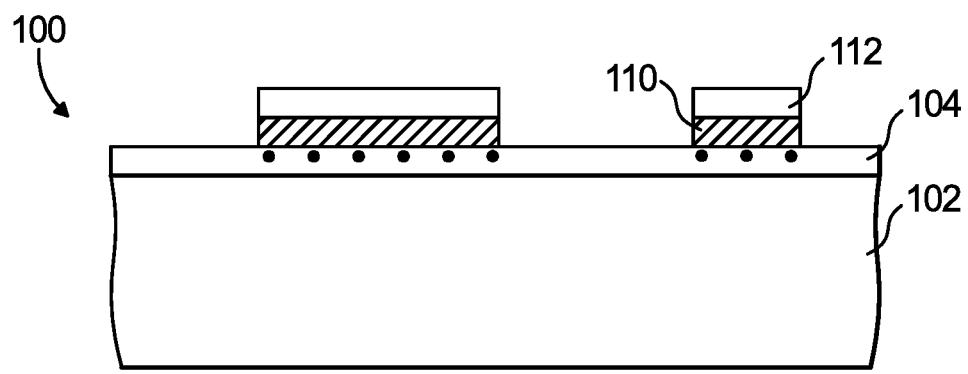
FIG. 7 is a schematic cross-sectional elevation view of the window or optic of FIG. 6, showing a the developed photoresist and a portion of the silicon oxynitride removed.
Figure 8:
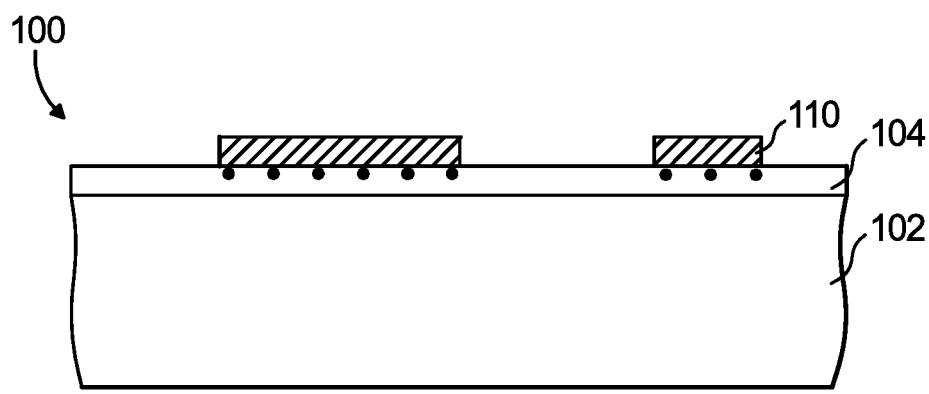
FIG. 8 is a schematic cross-sectional elevation view of the window or optic of FIG. 7, showing the photoresist removed.
Figure 9:
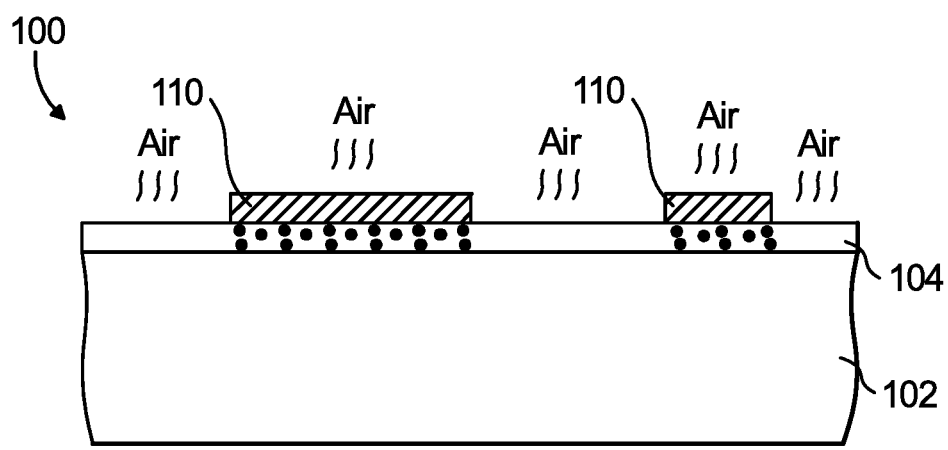
FIG. 9 is a schematic cross-sectional elevation view of the window or optic of FIG. 8, showing an annealing process in air and the dopant atoms diffused through the semiconductor coating to the substrate.

First, annealing the semiconductor coating 104 can include thermal annealing and/or laser annealing in a predetermined pattern to improve crystal quality of the TCO materials of the semiconductor coating 104 and increase electrical conductivity in doped areas of the semiconductor coating 104. Annealing the semiconductor coating 104 can include annealing in air to activate and diffuse dopant and increase oxygen in undoped areas of the semiconductor coating 104. Doping portions of the semiconductor coating can include applying a photoresist 106 over the semiconductor coating as shown in FIG. 2. The photoresist is selectively exposed and developed in the predetermined, spatially varied pattern, i.e., any pattern can be used, but in FIG. 3 spatial variation in the pattern includes a wider opening in photoresist 106 on the left than on the right opening in the photoresist 106. The method includes doping the semiconductor coating 104 through the openings 105 in the photoresist 106, as indicated by the downward arrows shown in FIG. 3. With reference to FIG. 4, the photoresist 106 is removed, e.g., using a solvent, to leave the doped semiconductor 108 in the pattern in the semiconductor coating 104. A coating of silicon oxynitride 110 is applied using plasma-enhanced chemical vapor deposition (PECVD) or the like over the entire surface of the semiconductor coating 104, as shown in FIG. 5. Hydrogen in the PECVD process increases conductivity by adding electrons and passivating defects in oxide semiconductors. A hydrogen plasma can also be used. While silicon oxynitride is used as an example herein, those skilled in the art will readily appreciate that any other suitable protective film can be used without departing from the scope of this disclosure. Another photoresist 112 is applied over the silicon oxynitride 110, as shown in FIG. 6. This photoresist 112 is exposed and developed in the inverse pattern of the first photoresist 106, and portions of the silicon oxynitride not covered by photoresist are removed as shown in FIG. 7, e.g., using diluted hydrofluoric acid ($HF:H_2O$). The remaining photoresist 112 is removed as shown in FIG. 8, to prepare the substrate for annealing. The method includes annealing the semiconductor coating 104, including annealing the silicon oxynitride 110 and semiconductor coating 104 in air, as indicated in FIG. 9, to activate and diffuse dopant and increase oxygen in undoped areas of the semiconductor coating 104. The sheet resistance of undoped $In_2O_3$ can be increased from <100 ohms/square to >2000 ohms/square by increasing oxygen with air annealing. The remaining portions of silicon oxynitride 110 can then be removed from the substrate as shown in FIG. 10, where the activated, annealed dopant in doped areas 108 forms the predetermined, electrically conductive pattern in semiconductor coating 104.

Figure 10:
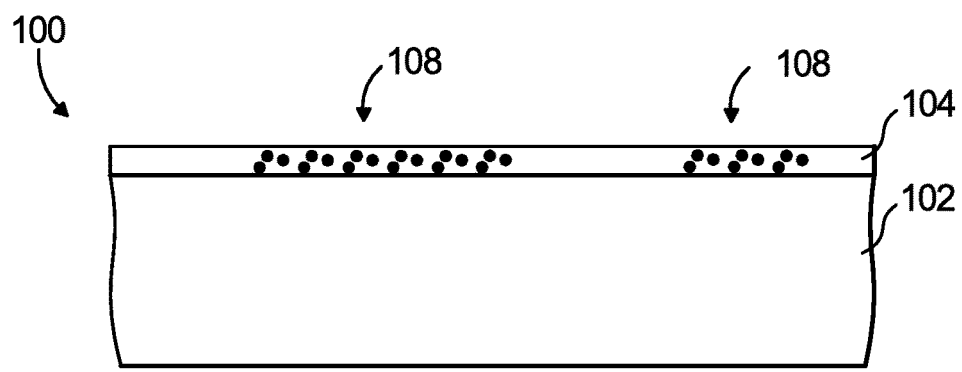
FIG. 10 is a schematic cross-sectional elevation view of the window or optic of FIG. 9, showing the silicon oxynitride removed to leave the electrically conductive pattern in the semiconductor coating.

Doping portions 108 of the semiconductor coating 104 and annealing the semiconductor coating 104 can include diffusing the doped semiconductor through the semiconductor coating 104 to the optical substrate 102, i.e. the dopant diffuses all the way through the thickness of the semiconductor coating 104, as shown in FIG. 10. The top surface of the semiconductor coating 104 can be covered in its entirety with the pattern, which can be varied spatially to achieve any desired electrical conductivity as a function of two-dimensional location on the window or optic 100. The optic or window 100 can thus be formed into a window having an electrically conductive coating, with broadband transparency, without etching and/or without polishing or post-process planarization. The activated doped semiconductor portions 108 and the semiconductor coating 104 can have closely matched indices of refraction to mitigate light scattering from the pattern. If the ratio of the indices of refraction of the doped semiconductor and semiconductor coating is between 0.82 and 1.22, the interface reflection will be less than 1% at normal incidence. For example, the indices of refraction of doped and undoped $In_2O_3$ at 632.8 nm are about 2.00 and 1.77, respectively. The index ratio of 1.13 produces a reflection of only 0.37%.

The resulting window or optic 100 shown in FIG. 10 includes a transparent substrate, i.e. optical substrate 102, with a coating over the transparent substrate, the coating being made of both a transparent semiconductor and an electrically conductive semiconductor, i.e., a semiconductor coating 104 with electrically conductive portions 108.

Figure 11:
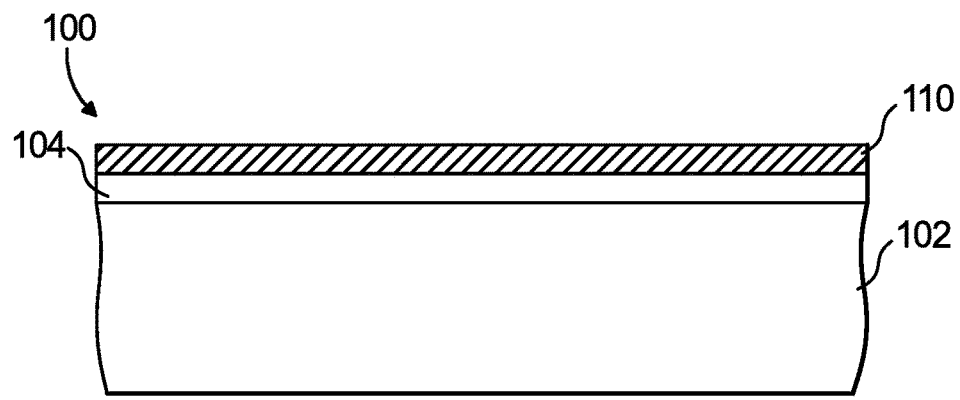
FIG. 11 is a schematic cross-sectional elevation view of the window or optic of FIG. 1, showing another embodiment of a method wherein the semiconductor coating is first coated with silicon oxynitride.
Figure 12:
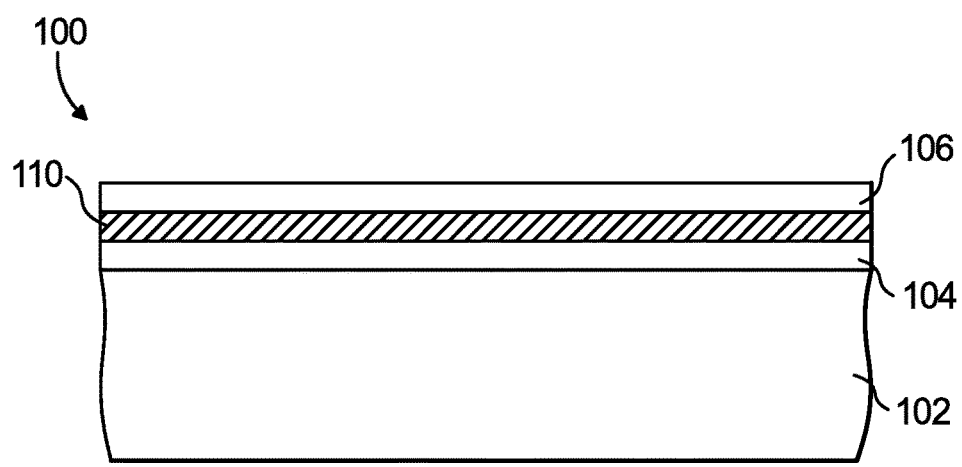
FIG. 12 is a schematic cross-sectional elevation view of the window or optic of FIG. 11, showing a layer of photoresist deposited on the silicon oxynitride.
Figure 13:
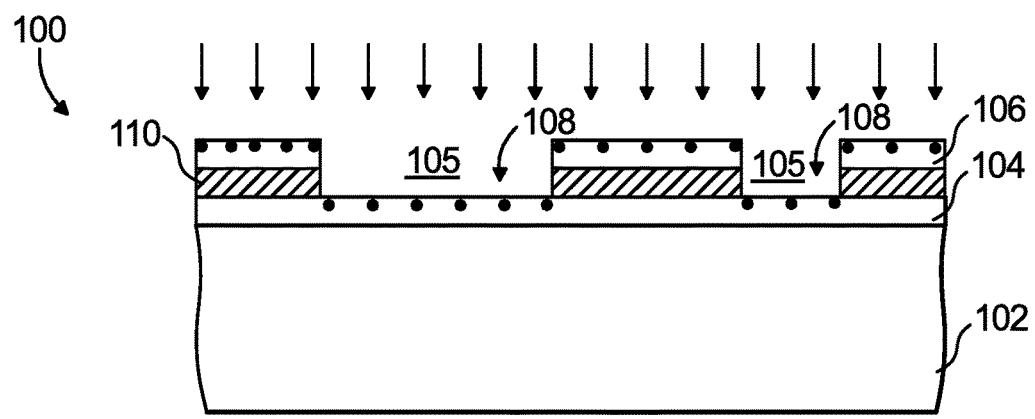
FIG. 13 is a schematic cross-sectional elevation view of the window or optic of FIG. 12, showing a portion of the developed photoresist and the silicon oxynitride removed to allow doping of the semiconductor coating in a predetermined spatially varied pattern.
Figure 14:
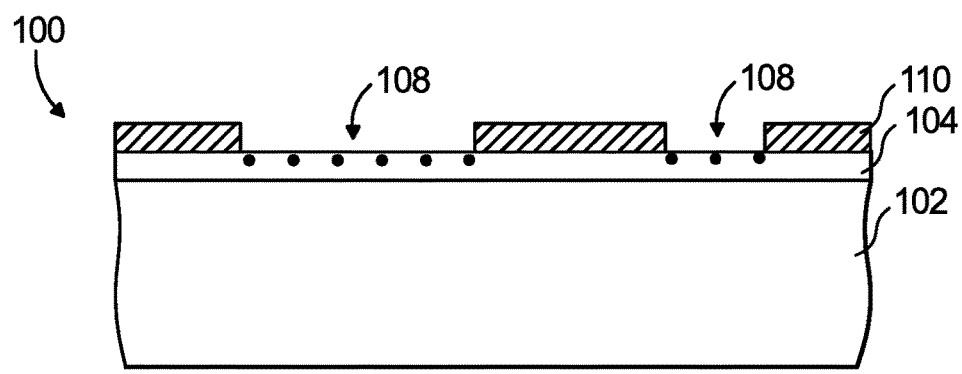
FIG. 14 is a schematic cross-sectional elevation view of the window or optic of FIG. 13, showing the photoresist removed and a doped pattern in the semiconductor coating.
Figure 15:
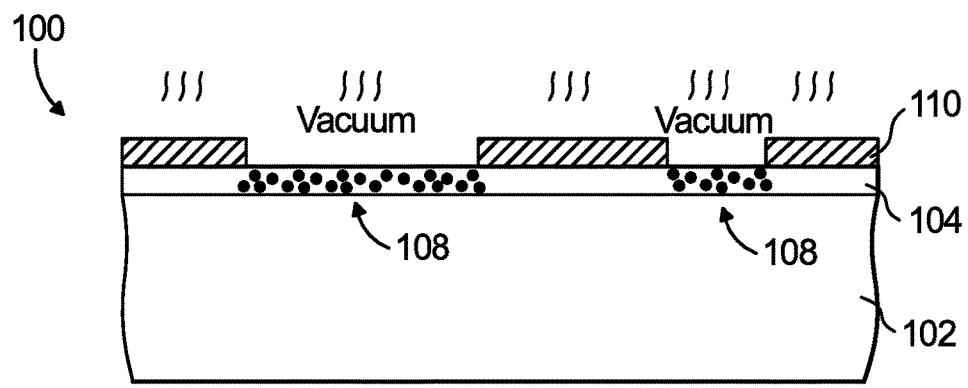
FIG. 15 is a schematic cross-sectional elevation view of the window or optic of FIG. 14, showing an annealing process in vacuum to form the electrically conductive pattern in the semiconductor coating, which after removal of the silicon oxynitride is as shown in FIG. 10.

With reference now to FIGS. 11-15, another method is described, wherein after the semiconductor coating 104 is deposited as shown in FIG. 11, a coating of silicon oxynitride 110 is applied over the entire surface of the semiconductor coating 104 with the semiconductor undoped. A photoresist 106 is applied over the silicon oxynitride 110, as shown in FIG. 12, and the photoresist 106 is exposed and developed. The developed photoresist 106 protects portions of the silicon oxynitride 110, and the unprotected portions of silicon oxynitride 110 are removed to expose portions 108 of the semiconductor coating 104 as shown in FIG. 13. As indicated by the downward arrows in FIG. 13, the semiconductor coating 104 is doped through openings 105 in the photoresist 106. Optionally, the photoresist 106 could be removed before doping, otherwise, the photoresist 106 is removed after doping as shown in FIG. 14 to leave the doped semiconductor portions 108 in the pattern in the semiconductor coating 104. Annealing the silicon oxynitride 110 and semiconductor coating 104 under vacuum, as indicated in FIG. 15, activates and diffuses the dopant and reduces oxygen in doped areas, i.e. portions 108, of the semiconductor coating 104. Oxygen vacancies contribute electrons and increase conductivity in oxide semiconductors. Without adding dopant atoms the sheet resistance of $In_2O_3$ can be reduced from >2000 ohms/square to <100 ohms/square by reducing oxygen with vacuum annealing. The silicon oxynitride 110 can then be removed to arrive at the structure shown in FIG. 10.

This disclosure relates to transparent conductive oxides (TCO) or oxide semiconductors where there is an increase or decrease of oxygen in selected areas during an annealing process. These oxygen changes decrease or increase the electron concentration and conductivity of the semiconductor, respectively. The sheet resistance of undoped In2O3 can be changed from >2000 ohms/square to <100 ohms/square and vice-versa by decreasing and increasing oxygen, respectively.

The methods and systems of the present disclosure, as described above and shown in the drawings, provide for optical coatings with superior properties including spatially controlled electrical conductivity for broadband windows and optics. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of coating an optical substrate, comprising:
    depositing a semiconductor coating over a surface of an optical substrate, wherein the semiconductor coating has broadband optical transmittance;
    doping portions of the semiconductor coating to form a spatially varied pattern of doped semiconductor in the semiconductor coating; and
    annealing the semiconductor coating to do at least one of:
        increase oxygen in undoped areas of the semiconductor coating; or
        reduce oxygen in doped areas of the semiconductor coating.

2. The method as recited in claim 1, wherein annealing the semiconductor coating includes laser annealing in a predetermined pattern to improve crystal quality of transparent conducting oxide (TCO) materials of the semiconductor coating and increase electrical conductivity in doped areas of the semiconductor coating.

3. The method as recited in claim 1, wherein annealing the semiconductor coating includes annealing in air to activate and diffuse dopant and increase oxygen in undoped areas of the semiconductor coating.

4. The method as recited in claim 1, wherein doping portions of the semiconductor coating includes:
    applying a photoresist over the semiconductor coating;
    selectively exposing the photoresist;
    developing the photoresist in the pattern;
    doping the semiconductor coating through openings in the photoresist;
    removing the photoresist to leave the doped semiconductor in the pattern on the semiconductor coating;
    applying a coating of silicon oxynitride over the entire surface of the semiconductor coating;
    applying a photoresist over the silicon oxynitride, exposing the photoresist, and developing the photoresist;
    removing portions of the silicon oxynitride not covered by photoresist and then removing any remaining photoresist; and
    wherein annealing the semiconductor coating includes annealing the silicon oxynitride and semiconductor coating in air to activate and diffuse dopant and increase oxygen in undoped areas of the semiconductor coating.

5. The method as recited in claim 1, wherein annealing the semiconductor coating includes annealing under vacuum to activate and diffuse dopant and reduce oxygen in doped areas of the semiconductor coating.

6. The method as recited in claim 1, wherein doping portions of the semiconductor coating includes:
    applying a coating of silicon oxynitride over the entire surface of the semiconductor coating with the semiconductor undoped;
    applying a photoresist over the silicon oxynitride, exposing the photoresist, and developing the photoresist;
    removing portions of the silicon oxynitride not covered by photoresist;
    doping the semiconductor coating through openings in the photoresist;
    removing the photoresist to leave the doped semiconductor in the pattern on the semiconductor coating; and
    wherein annealing the semiconductor coating includes annealing the silicon oxynitride and semiconductor coating in vacuum to activate and diffuse dopant and reduce oxygen in doped areas of the semiconductor coating.

7. A method as recited in claim 1, wherein the semiconductor coating includes at least one of $In_2O_3$ or ZnO.

8. A method as recited in claim 1, wherein doping portions of the semiconductor coating to form a spatially varied pattern includes applying dopant by ion implantation.

9. A method as recited in claim 1, wherein the doped semiconductor includes at least one of Sn, Mo, W, Ti, Al, or Ga.

10. A method as recited in claim 1, wherein the semiconductor coating has broadband optical transmittance in at least visible and infrared spectra.

11. A method as recited in claim 1, wherein depositing the semiconductor coating includes depositing the semiconductor coating with the semiconductor coating undoped.

12. A method as recited in claim 1, wherein doping portions of the semiconductor coating and annealing the semiconductor coating include diffusing dopant atoms through the semiconductor coating to the optical substrate.

13. A method as recited in claim 1, wherein depositing a semiconductor coating includes depositing the semiconductor coating over a surface of the optical substrate in its entirety.

14. A method as recited in claim 1, wherein doping portions of the semiconductor coating to form a spatially varied pattern includes doping a surface of the semiconductor coating so a surface of the semiconductor coating is covered in its entirety with the pattern.

15. A method as recited in claim 1, wherein the semiconductor coating including annealed activated doped semiconductor in the semiconductor coating and the optical substrate are formed into a window without etching.

16. A method as recited in claim 1, wherein the semiconductor coating including annealed activated doped semiconductor in the semiconductor coating and the optical substrate are formed into a window without polishing or post-process planarization.

17. A method as recited in claim 1, wherein the activated doped semiconductor and semiconductor coating have closely matched indices of refraction to mitigate light scattering.

18. A method as recited in claim 1, further comprising making the doped semiconductor electrically conductive.

19. A method as recited in claim 1, further comprising adding hydrogen to the doped semiconductor by plasma-enhanced chemical vapor deposition (PECVD) silicon oxynitride process or by a hydrogen plasma.

20. A window comprising:
   a transparent substrate with a coating over the transparent substrate, the coating being made of both a transparent semiconductor and an electrically conductive semiconductor with lower transparency than the transparent semiconductor, the electrically conductive semiconductor being annealed and distributed in a spatially varied pattern in the transparent semiconductor.

21. The window as recited in claim 20, wherein the electrically conductive semiconductor is laser annealed.

22. The window as recited in claim 20, wherein the transparent semiconductor coating includes a transparent conducting oxide (TCO) material, and wherein the electrically conductive semiconductor includes a semiconductor material doped for electrical conductivity, wherein the doped semiconductor includes at least one of Sn, Mo, W, Ti, Al, or Ga.

* * * * *